US008969965B2

(12) United States Patent
Chang et al.

(10) Patent No.: US 8,969,965 B2
(45) Date of Patent: Mar. 3, 2015

(54) FIN-LAST REPLACEMENT METAL GATE FINFET

(71) Applicant: International Business Machines Corporation, Armonk, NY (US)

(72) Inventors: Josephine B. Chang, Mahopac, NY (US); Michael A. Guillorn, Yorktown Heights, NY (US); Wilfried Ernst-August Haensch, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/149,295

(22) Filed: Jan. 7, 2014

(65) Prior Publication Data
US 2014/0117464 A1    May 1, 2014

Related U.S. Application Data

(62) Division of application No. 13/157,812, filed on Jun. 10, 2011, now Pat. No. 8,637,359.

(51) Int. Cl.
| H01L 27/01 | (2006.01) |
| H01L 27/12 | (2006.01) |
| H01L 31/0392 | (2006.01) |
| H01L 29/78 | (2006.01) |
| H01L 29/66 | (2006.01) |
| H01L 29/10 | (2006.01) |

(52) U.S. Cl.
CPC ........ H01L 29/785 (2013.01); H01L 29/66545 (2013.01); H01L 29/66795 (2013.01); H01L 29/1037 (2013.01)
USPC .................... 257/347; 257/E21.409; 438/164

(58) Field of Classification Search
USPC ........... 257/347, E21.409, E29.255; 438/163, 438/164, 200, 268
See application file for complete search history.

(56) References Cited

U.S. PATENT DOCUMENTS

| 6,844,238 B2 | 1/2005 | Yeo et al. |
| 7,923,337 B2 | 4/2011 | Chang et al. |

(Continued)

OTHER PUBLICATIONS

Kaneko et al., Sidewall transfer process and selective gate sidewall spacer formation technology for sub-15nm finfet with elevated source/drain extension, IEDM Technical Digest, pp. 844-847 (Dec. 2005).

(Continued)

Primary Examiner — Phuc Dang
(74) Attorney, Agent, or Firm — Vazken Alexanian; Michael J. Chang, LLC

(57) ABSTRACT

FinFET devices and methods for the fabrication thereof are provided. In one aspect, a method for fabricating a FET device includes the following steps. A wafer is provided having an active layer on an insulator. A plurality of fin hardmasks are patterned on the active layer. A dummy gate is placed over a central portion of the fin hardmasks. One or more doping agents are implanted into source and drain regions of the device. A dielectric filler layer is deposited around the dummy gate. The dummy gate is removed to form a trench in the dielectric filler layer. The fin hardmasks are used to etch a plurality of fins in the active layer within the trench. The doping agents are activated. A replacement gate is formed in the trench, wherein the step of activating the doping agents is performed before the step of forming the replacement gate.

6 Claims, 15 Drawing Sheets

(56) References Cited

U.S. PATENT DOCUMENTS

| | | |
|---|---|---|
| 2004/0198003 A1 | 10/2004 | Yeo et al. |
| 2005/0019993 A1 | 1/2005 | Lee et al. |
| 2005/0020020 A1 | 1/2005 | Collaert et al. |
| 2005/0121412 A1 | 6/2005 | Beintner et al. |
| 2006/0008968 A1 | 1/2006 | Brask et al. |
| 2006/0189043 A1 | 8/2006 | Schulz |
| 2009/0302372 A1 | 12/2009 | Chang et al. |
| 2009/0321849 A1 | 12/2009 | Miyamura et al. |
| 2010/0330755 A1 | 12/2010 | Hsiao et al. |
| 2011/0049628 A1* | 3/2011 | Okumura et al. ............. 257/347 |
| 2011/0147842 A1* | 6/2011 | Cappellani et al. ........... 257/365 |
| 2011/0183485 A1* | 7/2011 | Tateshita ....................... 438/294 |
| 2011/0291196 A1* | 12/2011 | Wei et al. ...................... 257/365 |
| 2012/0153398 A1* | 6/2012 | Baars et al. ................... 257/369 |
| 2012/0319213 A1 | 12/2012 | Yin et al. |

OTHER PUBLICATIONS

Kavalieros et al., Tri-Gate Transistor Architecture with High-k Gate Dielectrics, Metal Gates and Strain Engineering, Symposium on VLSI Technology 2006, pp. 50-51 (Jun. 2006).

Shang et al., Investigation of FinFET Devices for 32nm Technologies and Beyond, Symposium on VLSI Technology 2006, pp. 54-55 (Jun. 2006).

* cited by examiner

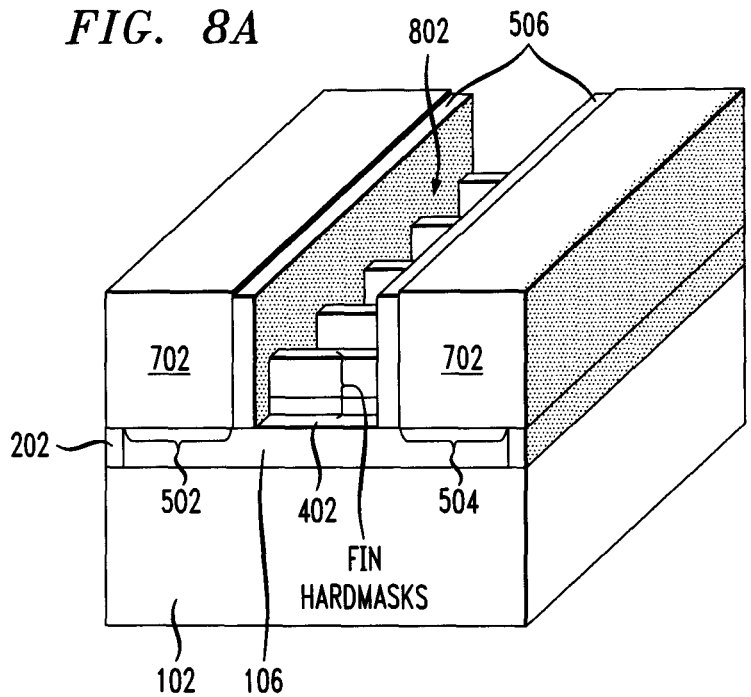
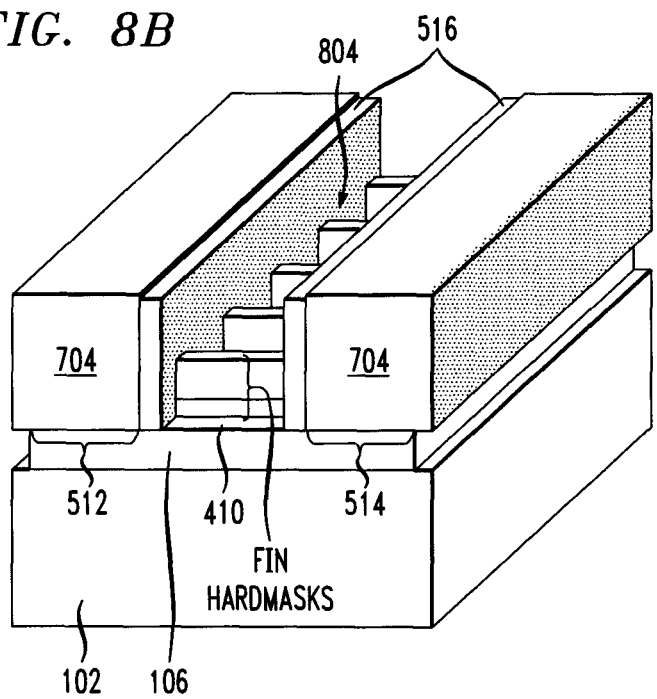

FIN-LAST REPLACEMENT METAL GATE FINFET

CROSS-REFERENCE TO RELATED APPLICATIONS

This application is a divisional of U.S. application Ser. No. 13/157,812 filed on Jun. 10, 2011, now U.S. Pat. No. 8,637,359, the contents of which are incorporated herein by reference as fully set forth herein.

FIELD OF THE INVENTION

The present invention relates to integrated circuits, and more particularly, to fin field effect transistor (FinFET) devices and methods for fabrication thereof.

BACKGROUND OF THE INVENTION

Due to their fast switching times and high current densities, fin field effect transistor (FinFET) devices are of a desired device architecture. In its basic form, a FinFET device includes a source, a drain and one or more fin-shaped channels between the source and the drain. A gate electrode over the fin(s) regulates electron flow between the source and the drain.

The architecture of a FinFET device, however, presents notable fabrication challenges. For example, as feature sizes of the devices get increasingly smaller (commensurate with current technology) accurately and consistently contacting the source and drain becomes a problem. Some previous demonstrations of FinFET devices have been on single fins, isolated devices or devices built at a greatly relaxed pitch. These characteristics allow the problem of contacting the source and drain to be sidestepped.

Source/drain landing pads are sometimes used to contact the fins, which provides mechanical stability during processing, simplifies the device contacting scheme and reduces external resistance. However, the landing pads have to be precisely aligned with the gate in order to achieve a practical gate pitch (in the case of logic layouts using minimum gate pitch) and to minimize variations in extrinsic resistance and parasitic capacitance. Properly and consistently aligning the landing pads with the gate is difficult. As a result, alternate contacting schemes that do not use landing pads have been proposed. Without landing pads however, contact has to be made with individual fins, which can be difficult, e.g., due to mismatches between minimum fin pitch and minimum pitch for contact vias.

Solutions such as epitaxially merged fins or use of contact bars to contact multiple fins have also been proposed. For example, epitaxial raised source and drain regions are used to reduce series resistance and simplify the contacting scheme. See, for example, Kaneko et al., *Sidewall transfer process and selective gate sidewall spacer formation technology for sub-15 nm finfet with elevated source/drain extension*, IEDM Technical Digest, pgs. 844-847 (2005), Kavalieros et al., *Tri-Gate Transistor Architecture with High-k Gate Dielectrics, Metal Gates and Strain Engineering*, Symposium on VLSI Technology 2006, pgs. 50-51 (2006) and Shang et al., *Investigation of FinFET Devices for 32 nm Technologies and Beyond*, Symposium on VLSI Technology 2006, pgs. 54-55 (2006).

Epitaxial processes, however, have drawbacks due to their extreme sensitivity to surface chemistry, crystal orientation and growth conditions. For example, with an epitaxial growth process, parasitic growth on the gate has to be prevented, the rest of the device structure has to be protected from aggressive pre-epitaxial cleans and the faceting and direction of epitaxial growth has to be controlled to minimize both parasitic capacitance and resistance and to achieve similar growth on differently doped source and drain surfaces.

Scaling fin width is another challenge for FinFET manufacturing. For schemes where the fins are formed before gate patterning, thin fins must survive gate and spacer processing, which often involves aggressive etching processes.

U.S. Patent Application Publication No. 2006/0189043 filed by Schulz (hereinafter "Schulz") describes a finFET device fabrication method involving use of a mask layer over a substrate, creating a trench in the mask layer, forming fins in the substrate within the trench and then forming a planarized gate electrode in the trench over the fins. The teachings of Schulz, however, do not provide for formation of fins with the precision and consistency needed for manufacture, especially in the context of scaled process technology.

Therefore, FinFET devices and methods for fabrication thereof that improve the device contacting scheme and scalability of the devices would be desirable

SUMMARY OF THE INVENTION

The present invention provides improved fin field effect transistor (FinFET) devices and methods for the fabrication thereof. In one aspect of the invention, a method for fabricating a field effect transistor device is provided. The method includes the following steps. A wafer is provided having an active layer on an insulator. A plurality of fin hardmasks are patterned on the active layer. A dummy gate is placed over a central portion of the fin hardmasks, wherein portions of the active layer outside of the dummy gate will serve as source and drain regions of the device. One or more doping agents are implanted into the source and drain regions. A dielectric filler layer is deposited around the dummy gate. The dummy gate is removed to form a trench in the dielectric filler layer, wherein the fin hardmasks are present on the active layer in the trench. The fin hardmasks are used to etch a plurality of fins in the active layer within the trench, wherein the fins will serve as a channel region of the device. The doping agents implanted into the source and drain regions are activated using rapid thermal annealing. A replacement gate is formed in the trench, wherein the step of activating the doping agents implanted into the source and drain regions is performed before the step of forming the replacement gate in the trench.

In another aspect of the invention, a field effect transistor device is provided. The device includes a source region; a drain region; a plurality of fins connecting the source region and the drain region, wherein the fins serve as a channel region of the device, and wherein the fins have a pitch of from about 20 nm to about 200 nm and each of the fins has a width of from about 2 nm to about 40 nm; a metal gate which at least partially surrounds each of the fins, wherein the source and the drain regions are self-aligned with the metal gate; and a dielectric filler layer around the metal gate.

A more complete understanding of the present invention, as well as further features and advantages of the present invention, will be obtained by reference to the following detailed description and drawings.

BRIEF DESCRIPTION OF THE DRAWINGS

FIG. 8A is a three-dimensional diagram illustrating the dummy gate having been removed forming a trench in the filler layer of FIG. 7A according to an embodiment of the present invention;

FIG. 8B is a three-dimensional diagram illustrating the dummy gate having been removed forming a trench in the filler layer of FIG. 7B according to an embodiment of the present invention;

DETAILED DESCRIPTION OF PREFERRED EMBODIMENTS

FIGS. 1-15 are diagrams illustrating an exemplary methodology for fabricating a fin field effect transistor (FinFET) device. As will be described in detail below, the present techniques make use of a damascene gate process to construct source/drain regions that are self-aligned with the gate.

The fabrication process begins with a semiconductor-on-insulator (SOI) wafer. See FIG. 1. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device. Thus, the SOI layer will be referred to herein as an active layer. In the example shown in FIG. 1, the starting wafer includes an active layer 106 over a BOX 102. For ease of depiction, a substrate typically located below the BOX, is not shown. According to an exemplary embodiment, active layer 106 is formed from a semiconducting material, such as silicon (Si) (e.g., crystalline silicon), silicon germanium (SiGe) or germanium (Ge). Thus, the active layer 106 may also be referred to as a "semiconductor device layer" or simply as a "semiconductor layer."

Further, active layer 106 preferably has a thickness of from about 5 nanometers (nm) to about 40 nm. Commercially available SOI wafers typically have a thicker SOI layer. Thus, the SOI layer of a commercial wafer can be thinned using techniques such as oxidative thinning to achieve the desired active layer thickness for the present techniques.

Next, at least one active area is defined in the active layer. This can be accomplished in a number of different ways, e.g., one being by way of shallow trench isolation (STI) and the other being by way of mesa isolation. Both scenarios will be presented in each of the following figures with the STI embodiment shown as the A subsection of each figure and the mesa isolation embodiment shown as the B subsection of each figure.

Figure 1:
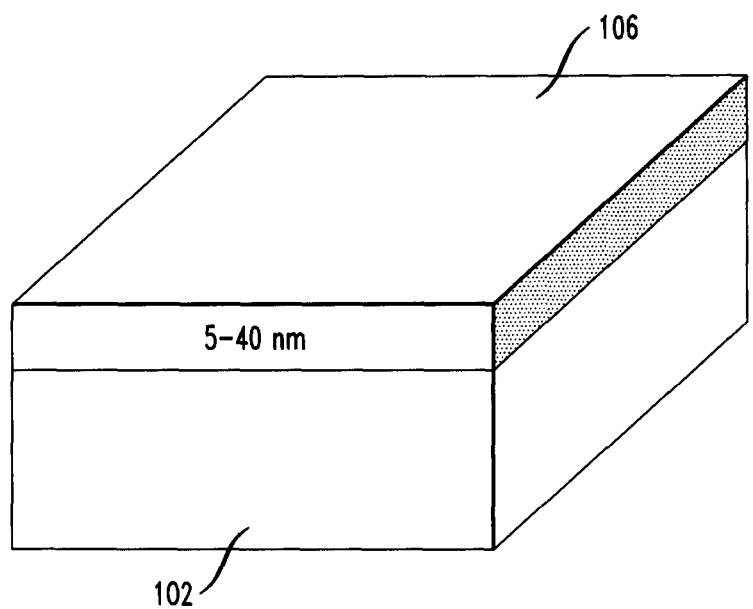
FIG. 1 is a three-dimensional diagram illustrating a semiconductor-on-insulator (SOI) wafer which is a starting structure for fabricating a fin field effect transistor (FinFET) device according to an embodiment of the present invention.
Figure 2A:
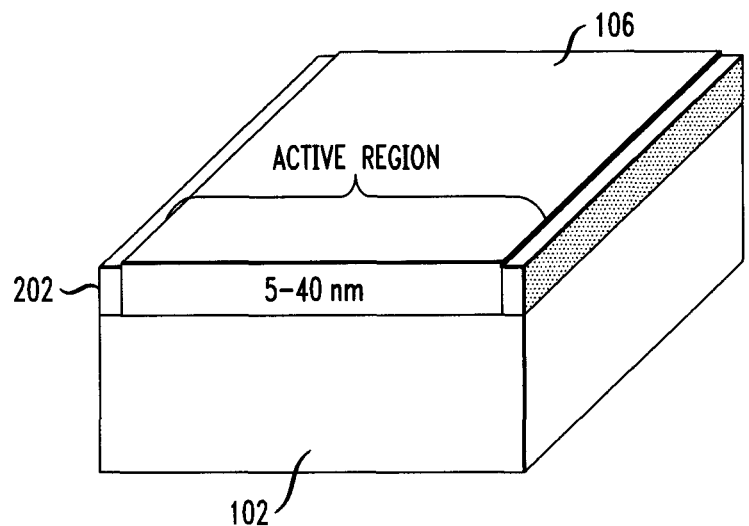
FIG. 2A is a three-dimensional diagram illustrating shallow trench isolation (STI) having been used to define an active area in the SOI wafer of FIG. 1 according to an embodiment of the present invention.

Thus, in the exemplary embodiment shown illustrated in FIG. 2A, STI is being used to define an active area in the active layer of the wafer of FIG. 1. The STI isolation process begins by first forming a dielectric hardmask (not shown) on portions of the active layer 106 that will serve as active areas of the device. Portions of the active layer 106 outside of the active area which are not protected by the dielectric hardmask are then removed, for example, using reactive ion etching (RIE) (these portions of the active layer 106 that are removed correspond to non-active areas of the device). An STI dielectric material is then blanket deposited onto the structure, e.g., using chemical vapor deposition (CVD), plasma enhanced CVD (PECVD), atomic or molecular layer deposition (ALD or MLD), spin on dielectric (SOD) or some combination of these techniques. Suitable STI dielectric materials include, but are not limited to, a silicon nitride liner followed by a silicon oxide fill. The deposited STI dielectric material can be planarized using a technique such as chemical-mechanical planarization (CMP) in order to remove the STI dielectric material from the active regions. The STI dielectric material that remains is shown in FIG. 2A as STI dielectric 202. The dielectric hardmask may then be removed from the active regions using RIE, wet chemical etch, vapor etching or some combination of these techniques to expose the active layer 106. Thus, according to this process, the portions of the active layer that were removed were replaced with an electrically isolating dielectric.

STI is generally employed with process technology in the nanometer to micrometer feature size range. As will be described in detail below, the present techniques are suitable for producing FinFET devices with gate lengths down to below 30 nm, e.g., gate lengths down to about 22 nm.

Alternatively, mesa isolation may be used to define active areas in the SOI wafer of FIG. 1. As will become apparent from the following description, fin hardmasks will be used to fabricate a plurality of fin-shaped channels of the device. With either the STI isolation technique or mesa isolation technique, the fin hardmasks may be fabricated before or after the isolation steps are performed. Thus, by way of example only, in FIG. 2A, it was shown that the STI isolation steps are performed before the fin hardmasks are formed. The process could however involve forming the fin hardmasks prior to performing the STI isolation steps. This is also the case with mesa isolation.

A factor to consider in deciding whether to form the fin hardmasks before or after isolation is that it may be beneficial to do the fin patterning at a point in the process where the topography on the wafer is less. Thus, in the case of mesa isolation, performing the isolation steps after the hardmask patterning may be advantageous as the fin patterning is a more challenging lithography step than the active area lithography. Fin patterning determines the shape of the channel and any non-uniformity in fin width will result in threshold voltage variation. Further, any line-edge roughness may also result in threshold voltage variations or degraded channel surface mobility. The active area patterning, on the other hand, determines the shape of the source and drain regions, which has less of an effect on device performance than the channel.

Figure 2B:
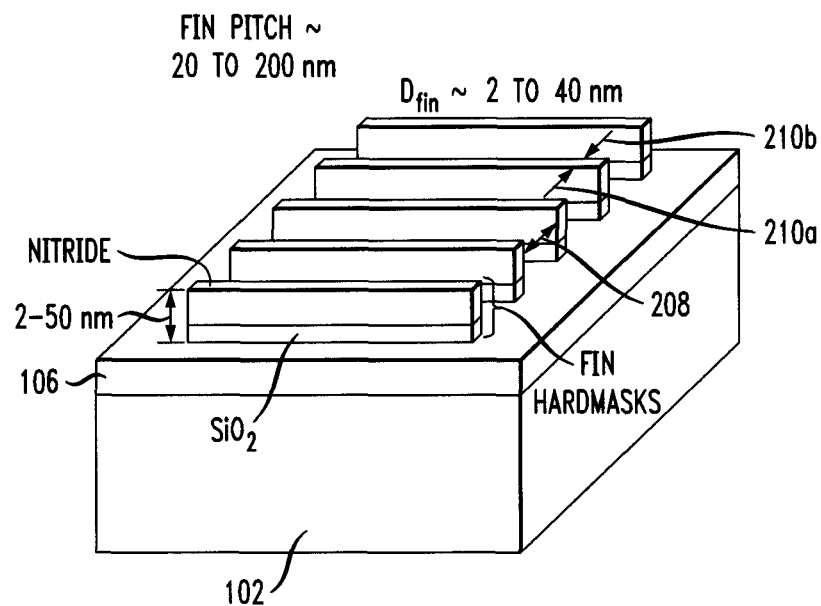
FIG. 2B is a three-dimensional diagram illustrating fin hardmasks having been deposited on the SOI wafer of FIG. 1 according to an embodiment of the present invention.

Therefore, in the exemplary embodiment shown illustrated in FIG. 2B, a plurality of fin hardmasks are fabricated on active layer 106. According to an exemplary embodiment, each of the fin hardmasks has a height of from about 2 nm to about 50 nm. As shown in FIG. 2B, the fin hardmasks may be formed by first depositing a fin hardmask material stack and then directly patterning the stack using lithography and etching to form the individual fin hardmasks. According to an exemplary embodiment, the fin hardmask material stack includes an oxide (e.g., $SiO_2$) layer thermally grown on active layer 106 to a thickness of from about 1 nm to about 25 nm, and a nitride layer deposited using low-pressure chemical vapor deposition (LPCVD) on the $SiO_2$ layer to a thickness of from about 1 nm to about 25 nm. Other materials which could be included in the fin hardmask include a carbon material which is stable at high-temperatures or hafnium oxide ($HfO_2$) or tantalum nitride (TaN). By way of example only, these other materials can each be used individually as a fin hardmask or incorporated in a multilayer stack using some combination of these materials (like with the oxide/nitride example provided above) provided that the uppermost layer can act as an etch mask for the lower underlying layer or layers and that at least one layer in the stack is an etch mask for a semiconductor material (i.e., active layer) etch (as is the case with the oxide/nitride example provided above).

The fin hardmask material stack is then directly patterned to form a plurality of individual fin hardmasks. See, for example, FIG. 2B. According to an exemplary embodiment, fin hardmasks are produced with a pitch, i.e., a distance between each adjacent fin hardmask, (as indicated by arrow 208) of from about 20 nm to about 200 nm, and a width $D_{fin}$ (as indicated by arrows 210a and 210b) of from about 2 nm to about 40 nm. As such, the resulting fins will also have a pitch, i.e., a distance between adjacent fins, of from about 20 nm to about 200 nm, and a width of from about 2 nm to about 40 nm.

Alternately, the fin hardmasks could be fabricated using a pitch doubling technique such as sidewall image transfer. For example, a sacrificial mandrel material such as polycrystalline silicon (poly Si) or carbon may be deposited and patterned, and then the desired fin hardmask material or materials (see above) may be deposited conformally on the sacrificial mandrel and etched anisotropically to form spacers on sidewalls of the mandrels. The sacrificial mandrels can then be removed, leaving only the fin hardmask material. Pitch doubling techniques such as sidewall image transfer are generally known to those of skill in the art and thus are not described further herein. Unwanted fin hardmask patterns can also be removed using lithography and etching. The etching technique used to remove the unwanted hardmask should be selected to preferentially remove the hardmask without removing the other films exposed in the front-end-of-line (FEOL) structure, specifically silicon. This technique should also be compatible with the lithographyically defined masking material (e.g., photoresist). An example of this process includes but is not limited to a fluorocarbon-based RIE process in the case of a silicon nitride (SiN) hardmask or a $BCl_3$-based RIE process in the case of $HfO_2$ or TaN.

In a further embodiment, the fin hardmasks can be fabricated using directed self assembly using a diblock copolymer and a suitable templating scheme. For example, a carbon-containing layer and a hardmask layer can be deposited onto the fin hardmask material using spin on or CVD-based techniques. Examples of the carbon-containing layer include, but are not limited to, amorphous carbon deposited by CVD or an organic planarizing layer deposited by spin casting. Examples of the hard mask layer include, but are not limited to, silicon oxide, nitride or oxynitride films, deposited by low temperature CVD, PECVD or ALD. Additionally, this layer may be composed of a silicon-containing or titanium-containing ARC-layer deposited by spin coating or a TaN, $HfO_2$ or aluminum oxide ($Al_2O_3$) film deposited by ALD. Once these films are in place, a templating pattern can be formed on the surface of the hardmask layer using lithography and chemoepitaxy of a suitable neutralization layer. The lithographic pattern can be dissolved revealing the underlying hardmask layer. A diblock-copolymer of poly-styrene (PS) and poly(methyl methacrylate) (PMMA) can be spin cast onto the surface and annealed to form polymer lamellae of alternating PS and PMMA. The period of the PS-PMMA pattern can be adjusted by tuning the molecular weight of the polymers resulting in ordered patterns with a pitch of from about 20 nm to about 50 nm. The PMMA can be removed from the pattern using a selective RIE process. After formation of this pattern, the pattern can by etched into the hardmask layer on top of the organic planarizing layer. The subsequent pattern can be transferred into the hardmask pattern as described above. Unwanted regions of the pattern can be removed with further lithography and etching, as described above.

Figure 3A:
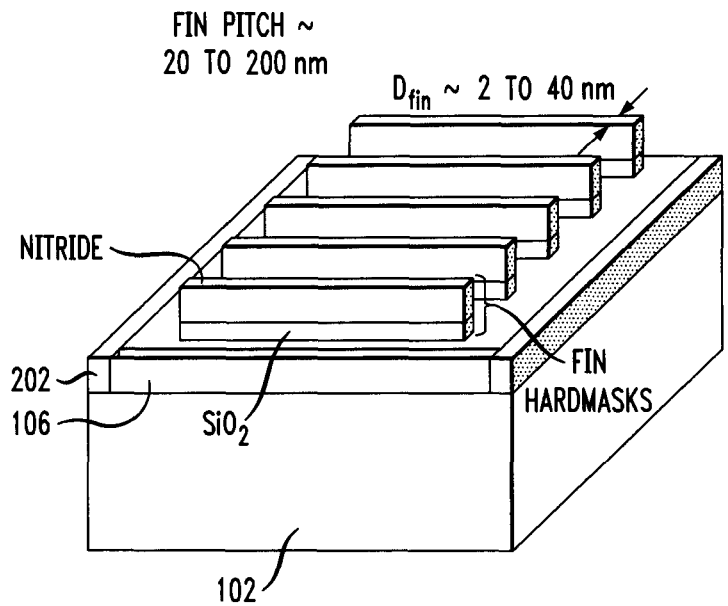
FIG. 3A is a three-dimensional diagram illustrating fin hardmasks having been deposited on the SOI wafer of FIG. 2A according to an embodiment of the present invention.

Similarly, in the exemplary embodiment shown in FIGS. 2A and 3A (embodiment wherein STI was used to define the active area), a plurality of fin hardmasks are defined on the active layer 106. The fin hardmasks may be formed using the same techniques described immediately above, and thus as shown in FIG. 3B, the fin hardmasks can have the same composition (e.g., dual oxide (e.g., $SiO_2$)/nitride hardmask) and dimensions as described in conjunction with the description of FIG. 2B, above.

Figure 3B:
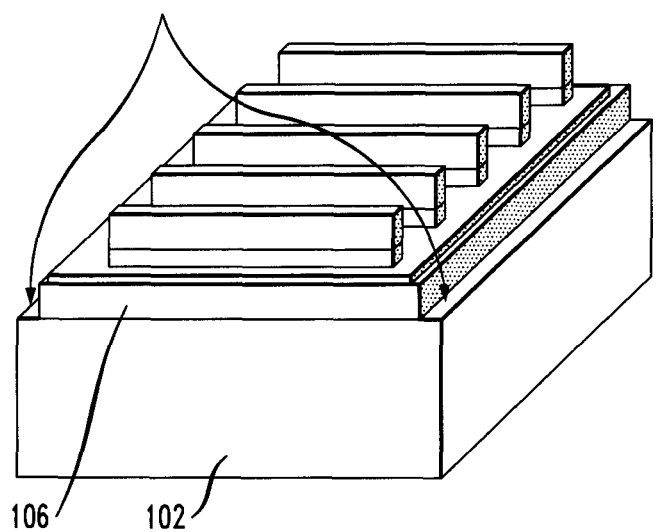
FIG. 3B is a three-dimensional diagram illustrating mesa isolation having been used to define an active area in the SOI wafer of FIG. 2B according to an embodiment of the present invention.

In the case of mesa isolation, as shown in FIG. 3B, the isolation steps (if not already performed prior to the hardmask formation) may now be carried out to define an active area in the active layer 106. According to an exemplary embodiment, the mesa isolation is carried out by first forming a dielectric hardmask (not shown) on portions of the active layer 106 that will serve as active areas of the device. Portions of the active layer 106 outside of the active area which are not protected by the dielectric hardmask are then removed, for example, using RIE (these portions of the active layer 106 that are removed correspond to non-active areas of the device).

Next, to begin the damascene gate process, a dummy gate is formed. The dummy gate formation process involves first depositing a stack of dummy gate materials on the active layer 106 and then patterning the materials to form the dummy gate over a central portion of the fin hardmasks. Namely, according to an exemplary embodiment, the stack of dummy gate materials includes an oxide layer on the active layer (to act as an etch stop for the dummy gate etch, shown as oxide layer 402 in FIG. 4A or oxide layer 410 in FIG. 4B, see below) and a poly Si layer on the oxide layer. A silicon nitride hardmask layer (which is not considered to be a part of the dummy gate since it serves to protect the top of the dummy gate from processes that effect the dummy gate material such as RIE, epitaxial silicon growth or silicidation and will be removed from on top of the dummy gate later in the process) may be formed on the poly Si layer. By way of example only, the oxide layer may be formed by thermally oxidizing the exposed surface of the active layer 106 or may be deposited onto active layer 106 using, for example, CVD or ALD. In either case, the oxide layer has a thickness of from about 0.5 nm to about 2 nm. The poly Si layer may be deposited on the oxide layer and over the fin hardmasks using CVD to a thickness of from about 40 nm to about 200 nm. The silicon nitride hardmask layer may be deposited on the poly Si layer using CVD to a thickness of from about 10 nm to about 100 nm.

Further, since the dummy gate materials are being deposited over the fin hardmasks rather than a flat surface, it may be desirable to planarize one of the layers of the materials (e.g., using CMP) after deposition in order to reduce topography. For example, after depositing the poly Si layer, the poly Si layer may be planarized (e.g., using CMP) in order to provide a flat surface on which to deposit the silicon nitride hardmask layer.

Figure 4A:
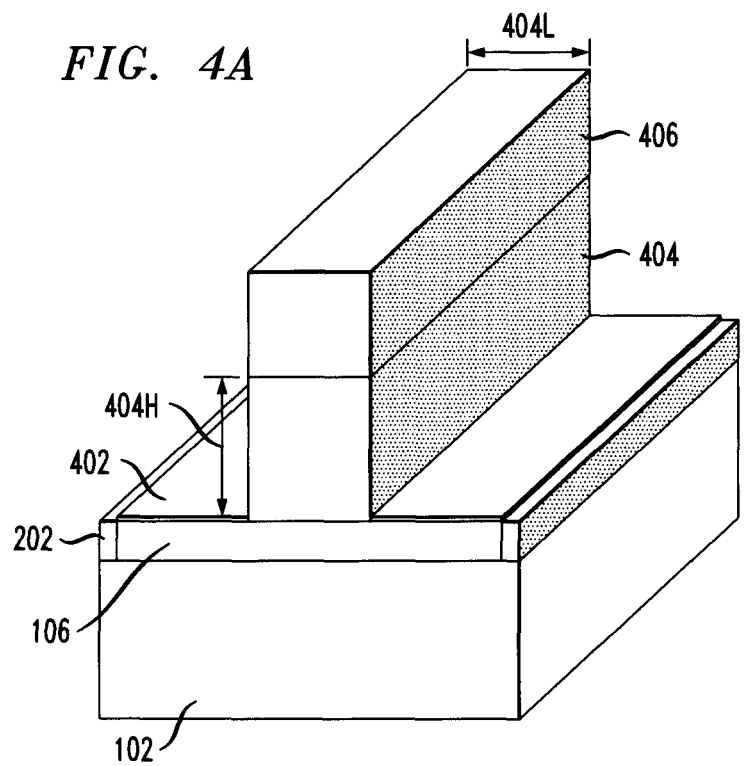
FIG. 4A is a three-dimensional diagram illustrating a dummy gate structure having been placed over a central portion of the fin hardmasks of FIG. 3A and portions of the fin hardmasks that extend out from under the dummy gate having been optionally removed, wherein portions of an active layer of the wafer not covered by the dummy gate will serve as source and drain regions of the device according to an embodiment of the present invention.
Figure 4B:
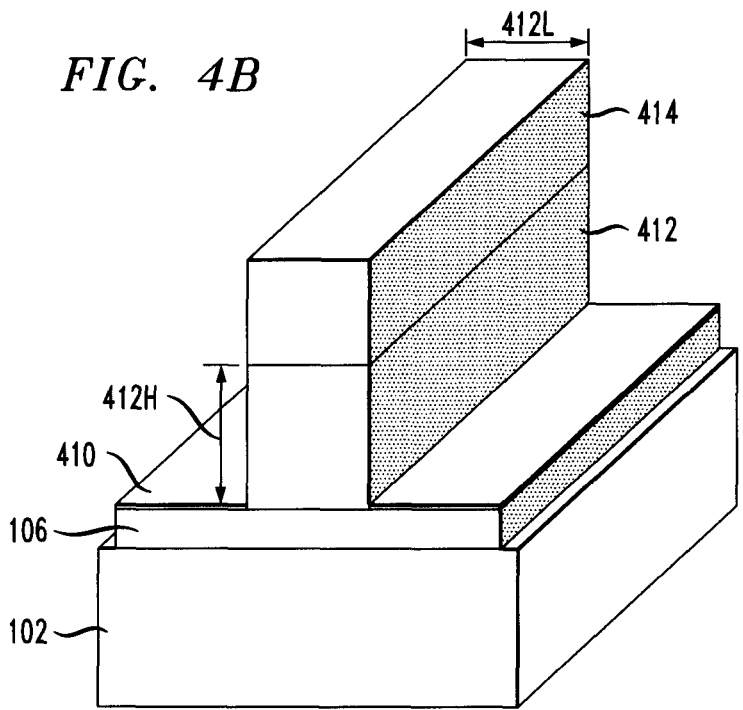
FIG. 4B is a three-dimensional diagram illustrating a dummy gate structure having been placed over a central portion of the fin hardmasks of FIG. 3B and portions of the fin hardmasks that extend out from under the dummy gate having been optionally removed, wherein portions of an active layer of the wafer not covered by the dummy gate will serve as source and drain regions of the device according to an embodiment of the present invention.

Next, the stack of materials is patterned to form dummy gates 404 (FIG. 4A) and 412 (FIG. 4B). Patterning is achieved using lithography (i.e., photolithographic patterning of a resist stack) and etching (i.e., RIE), resulting in the removal of all but a central portion of the poly Si layer located centrally over the fin hardmasks (using the oxide layer 402 or 410 as an etch stop), which is dummy gate 404 (FIG. 4A)/412 (FIG. 4B). The silicon nitride hardmask layer is also patterned in this process forming a silicon nitride hardmask 406/414 on top of the dummy gate 404/412, respectively. As highlighted above, the silicon nitride hardmask will serve to protect the top of the dummy gate and will be removed later in the process. According to an exemplary embodiment, the dummy gate 404 or 412 has a height (shown as height 404H in FIG. 4A or height 412H in FIG. 4B) of from about 40 nm to about 200 nm, and a length (shown as length 404L in FIG. 4A or height 412L in FIG. 4B) of from about 5 nm to about 45 nm. It is notable that portions of the fin hardmasks not covered by the dummy gate (i.e., portions of the fin hardmask that extend out from under the dummy gate) may be etched away using an additional and subsequent etch step. However, this step is optional. It may be advantageous to keep the portions of the fin hardmasks not covered by the dummy gate because they can be used to introduce a self-aligned texture to the source and drain regions of the device. These portions of the fin hardmasks may be removed using RIE, wet chemical etching, vapor etching or some combination of these techniques.

The dummy gate defines a portion of the active layer 106 in which fins will be formed (see below), the fins serving as a channel region of the device. Portions of active layer 106 not covered by the dummy gate (also referred to herein as being outside of the dummy gate) will serve as source and drain regions of the device. The source and drain regions may now be fabricated using any suitable techniques well known to those of skill in the art, including, for example, use of spacers, ion implantation, source/drain recess, epitaxial growth of embedded source/drain materials, activation anneals and/or salicide formation.

Figure 5A:
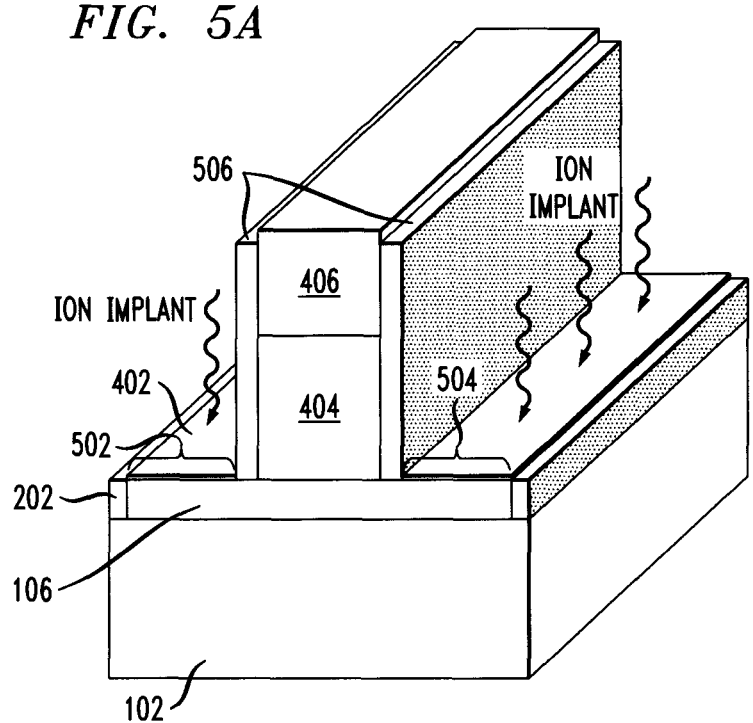
FIG. 5A is a three-dimensional diagram illustrating an ion implant being performed into the source and drain regions of FIG. 4A according to an embodiment of the present invention.

For example, following from FIG. 4A (embodiment wherein STI was used to define the active area), FIG. 5A illustrates an ion implant being performed into source/drain regions 502 and 504. As shown in FIG. 5A, the ion implant is being offset from the channel region by optional spacers 506 which have been formed on the sidewalls of the dummy gate 404 and silicon nitride hardmask 406. Spacers 506 may also be desirable in order to protect the dummy gate material from subsequent processes such as silicide or epitaxy (see below). Spacers 506 may be fabricated using any conventional process known in the art and may be formed from any suitable spacer material (e.g., a nitride material). According to an exemplary embodiment, source/drain regions 502 and 504 are doped using top-down deep implants with a doping agent. Suitable doping agents include, but are not limited to boron, arsenic and phosphorous. The doping agents implanted into the source and drain regions can either be activated at this point with high-temperature rapid thermal anneal (RTA) or at any subsequent point in the fabrication process depending on the thermal stability and thermal requirements of the specific replacement gate flow desired. For example, the RTA can be performed with or without the silicide in place or with no silicide in place and one or more dielectric films present on the source/drain regions. The same process may be performed to form source/drain regions 512 and 514 in the mesa isolation embodiment (i.e., including forming spacers 516 on the sidewalls of the dummy gate 412 and silicon nitride hardmask 414 to offset the ion implant from the channel region and protect the dummy gate during subsequent processing steps). See FIG. 5B, which follows from FIG. 4B. Portions of the etch stop oxide layer 402 (FIG. 5A) or etch stop oxide layer 410 (FIG. 5B) are still present under the dummy gate stack, but can be removed from the source and drain regions (using for example any one of a variety of conventional wet cleans such as post-RIE hydrogen fluoride (HF)-dips).

By contrast, with conventional process flows such as that described for example in Schulz (see above), a dummy gate is not employed to fabricate the source/drain regions before formation of the gate. Further, as described above, conventional process flows do not provide for formation of fins with the precision and consistency needed for manufacture, especially in the context of scaled process technology.

Figure 5B:
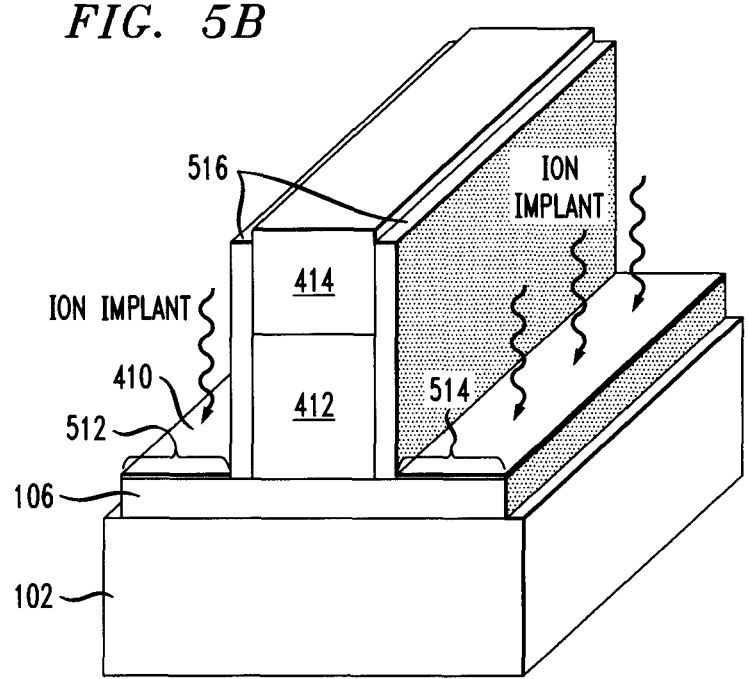
FIG. 5B is a three-dimensional diagram illustrating an ion implant being performed into the source and drain regions of FIG. 4B according to an embodiment of the present invention.
Figure 6A:
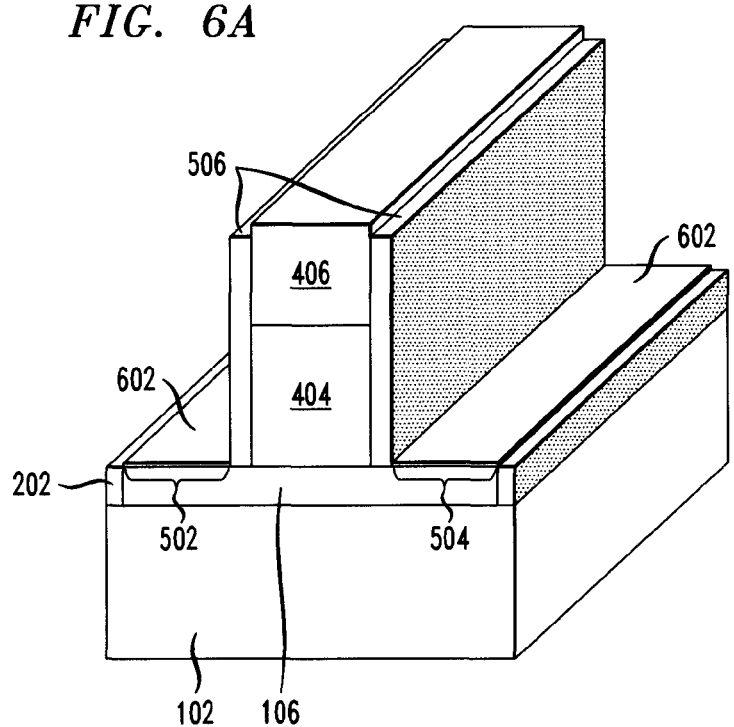
FIG. 6A is a three-dimensional diagram illustrating silicide regions having been formed on the source and drain regions of FIG. 5A according to an embodiment of the present invention.
Figure 6B:
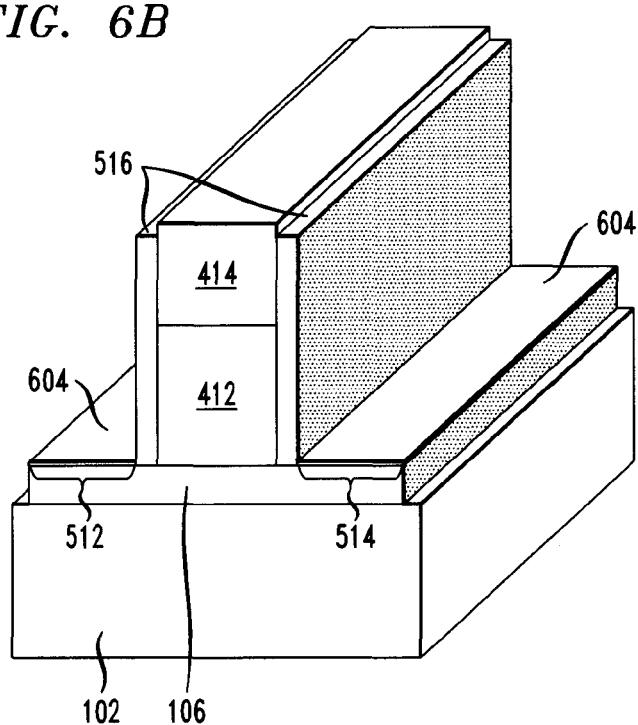
FIG. 6B is a three-dimensional diagram illustrating silicide regions having been formed on the source and drain regions of FIG. 5B according to an embodiment of the present invention.

A silicide-first or a silicide-last process may be used to form silicide regions on the source/drain regions. With the former, silicide regions 602 (FIG. 6A) or 604 (FIG. 6B) may, at this point in the process, be formed on source/drain regions 502/504 (FIG. 6A) or 512/514 (FIG. 6B). Due to thermal constraints of the silicide material and the thermal requirements of other steps such as gate stack formation, it may be preferable to form a silicide layer only after the final gate metal has been put in place, using, for example, a silicide formed at the bottom of a trench created in a dielectric layer, referred to hereinafter as a trench silicide. This is a silicide-last approach. As throughout the description, FIG. 6A which follows from FIG. 5A represents the embodiment wherein STI was used to define the active area and FIG. 6B which follows from FIG. 5B represents the embodiment wherein mesa isolation was used to define the active area.

Next a dielectric filler layer 702 (FIG. 7A) or 704 (FIG. 7B) is deposited around the dummy gate. As throughout the description, FIG. 7A which follows from FIG. 6A represents the embodiment wherein STI was used to define the active area and FIG. 7B which follows from FIG. 6B represents the embodiment wherein mesa isolation was used to define the active area. Filler layer 702 (FIG. 7A) or 704 (FIG. 7B) can include any suitable filler material, including a dielectric material, such as $SiO_2$ deposited by a CVD, PECVD, ALD or spin on technique or any combination of these techniques.

CMP is then used to planarize the dielectric filler material, thereby exposing a top of the dummy gate. Hardmask 406 or 414 and portions of the spacers 506 or 516 above the dummy gate may be removed in this process. If some hardmask and/or spacer material remain, a subsequent etch step using RIE, wet chemical or vapor etching can be used to remove the remaining material. For example, phosphoric acid at an elevated temperature can be used to achieve high selectivity removal of the SiN film with respect to $SiO_2$. See FIG. 6A and FIG. 6B, respectively. Accordingly, the dielectric filler layer 702 or 704 will have a thickness equivalent to the height of the dummy gate 404 or 412, respectively, e.g., from about 40 nm to about 200 nm.

Figure 7A:
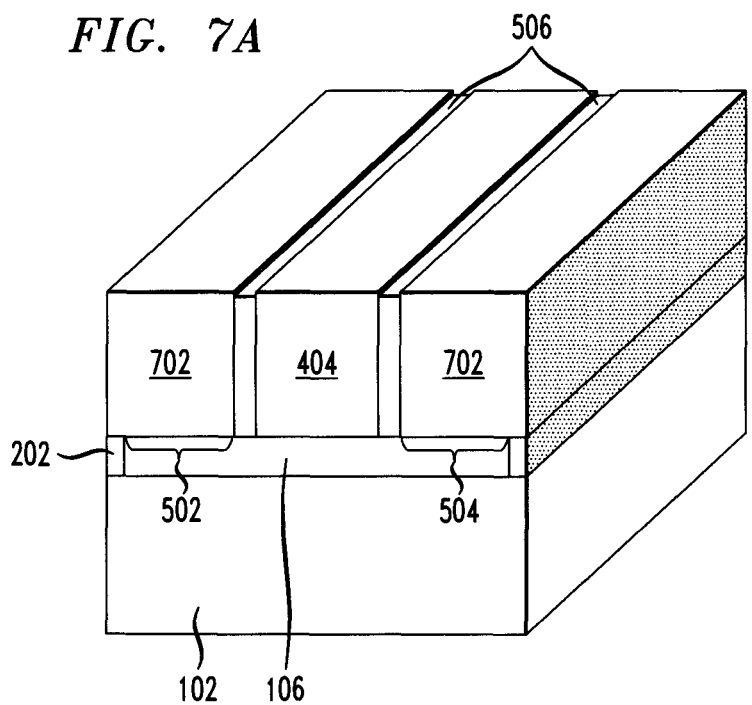
FIG. 7A is a three-dimensional diagram illustrating a filler layer having been deposited around the dummy gate of FIG. 6A according to an embodiment of the present invention.
Figure 7B:
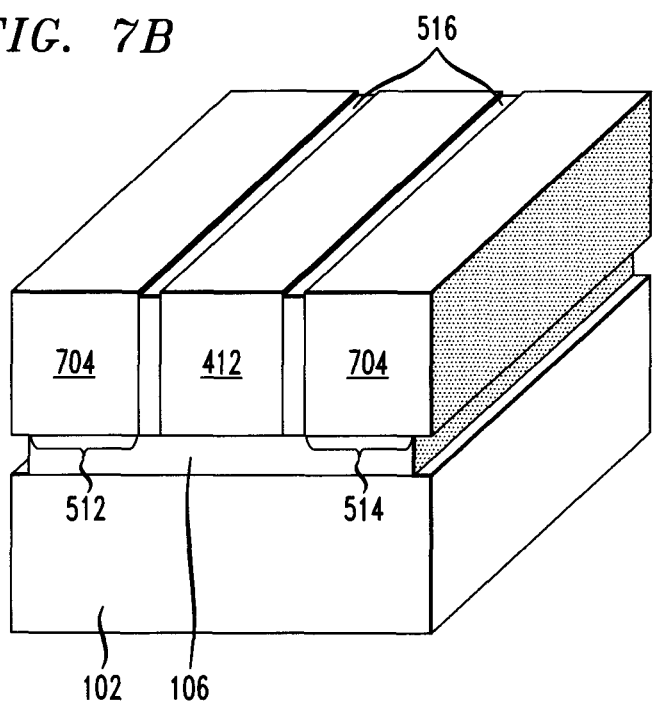
FIG. 7B is a three-dimensional diagram illustrating a filler layer having been deposited around the dummy gate of FIG. 6B according to an embodiment of the present invention.

Next, the dummy gate 404/412 is removed forming a gate trench 802/804 in filler layer 702/704. See FIGS. 8A and 8B, respectively. As throughout the description, FIG. 8A which follows from FIG. 7A represents the embodiment wherein STI was used to define the active area and FIG. 8B which follows from FIG. 7B represents the embodiment wherein mesa isolation was used to define the active area. Since trench 802/804 is a negative pattern of dummy gate 404/412, trench 802/804 is also located centrally over the fin hardmasks. See FIGS. 8A and 8B, respectively. According to an exemplary embodiment, gate trench 802/804 distinguishes a fin channel region of the FinFET device from source and drain regions of the device.

The dummy gate can be removed using wet chemical etching or dry etching. According to an exemplary embodiment, a wet etch (such as TMAH or a warm ammonia etch) or a dry etch such as RIE is used to remove dummy gate 404/412 selective to the filler material 702/704, respectively. The oxide layer 402 (FIG. 8A) or 410 (FIG. 8B) acts as an etch stop during the dummy gate removal process.

Techniques for employing a dummy gate structure in conjunction with a FinFET architecture are also described in U.S. Pat. No. 7,923,337 issued to Chang et al., entitled "Fin Field Effect Transistor Devices with Self-Aligned Source and Drain Regions," and in U.S. Patent Application Publication No. 2009/0302372 filed by Chang et al., entitled "Fin Field Effect Transistor Devices with Self-Aligned Source and Drain Regions," the contents of both of which are incorporated by reference herein. The use of a dummy gate is an important aspect of the present techniques. Firstly, the dummy gate allows for the fin hardmasks to be placed prior to forming the filler layer, such that when the dummy gate is removed, the fin hardmasks revealed are already present within the trench. The fin hardmasks are important for more precise and uniform fins to be formed in the fin region. Patterning well-defined fins with straight sidewalls inside the trench without the fin hardmasks already present would be extremely difficult, if at all possible, due to the topography within the trench. As described above, minimizing variations in fin dimensions is desirable as variations can change the device threshold. Secondly, the dummy gate enables the source/drain regions to be fabricated prior to introduction of the final (replacement) gate material. This sequence allows high temperature steps such as source/drain dopant activation to be used which may be detrimental to the final gate material.

Next, fins are formed in active layer 106. See FIGS. 9A and 9B, respectively. As throughout the description, FIG. 9A which follows from FIG. 8A represents the embodiment wherein STI was used to define the active area and FIG. 9B which follows from FIG. 8B represents the embodiment wherein mesa isolation was used to define the active area.

According to an exemplary embodiment, an anisotropic (e.g., silicon) RIE is used to remove portions, i.e., portions 902/904, of active layer 106 in trench 802/804 not masked by the fin hardmasks. See FIGS. 9A and 9B, respectively. BOX 102 acts as an etch stop. The oxide layer 402/410 may be removed by adding a break-through step in the fin RIE sequence or by using a short wet-etch prior to the RIE.

An advantage of the present teachings is that the fins are etched only within trench 802/804, leaving the source/drain regions of the device intact below the respective filler layer. Further, the source/drain regions produced in this manner will be self-aligned with trench 802/804 and thus with a device gate that will be formed in the trench (see below).

As described above, the present techniques can be used to form fins having a pitch, i.e., a distance between adjacent fins, of from about 20 nm to about 200 nm, and a width of from about 2 nm to about 40 nm. Further, each of the fins can have a height of from about 10 nm to about 50 nm.

Figure 9A:
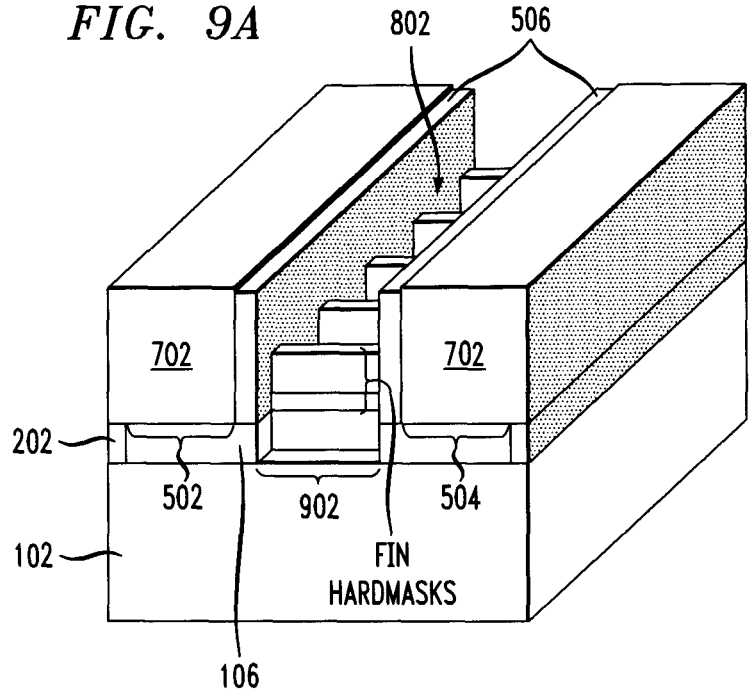
FIG. 9A is a three-dimensional diagram illustrating fins having been formed in the active layer of FIG. 8A according to an embodiment of the present invention.
Figure 9B:
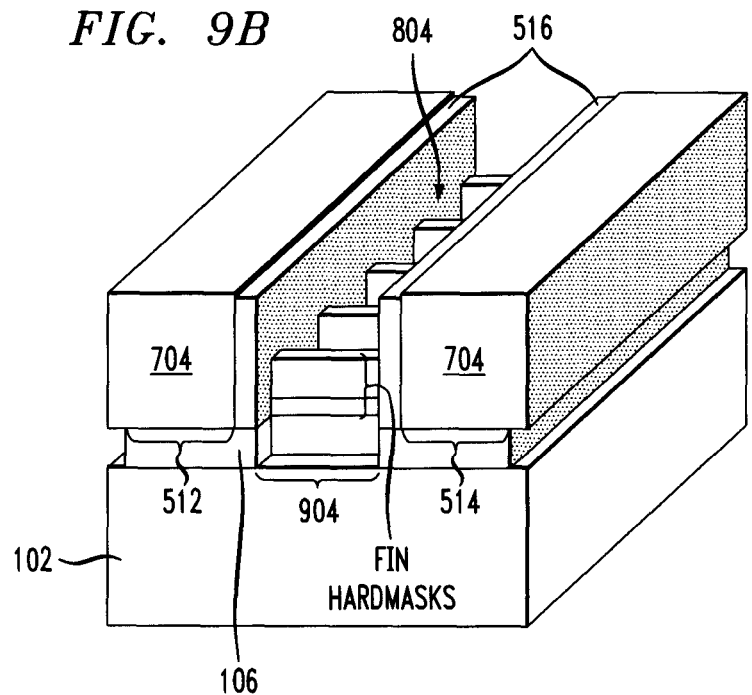
FIG. 9B is a three-dimensional diagram illustrating fins having been formed in the active layer of FIG. 8B according to an embodiment of the present invention.

Inner spacers 1002/1004 may optionally be formed in trench 802/804. See FIGS. 10A and 10B, respectively. As throughout the description, FIG. 10A which follows from FIG. 9A represents the embodiment wherein STI was used to define the active area and FIG. 10B which follows from FIG. 9B represents the embodiment wherein mesa isolation was used to define the active area. This step is optional. Placing spacers between what will be the source/drain regions of the device and the device gate (that will be formed in trench 802/804, see below) will help to minimize parasitic capacitance in the completed device, but is not necessary for preventing gate-to-source/drain shorting during raised source/drain (RSD) epitaxial growth or silicide, i.e., as in typical FinFET flows.

According to an exemplary embodiment, inner spacers 1002/1004 are formed by first conformally depositing a nitride layer into trench 802/804, respectively. An anisotropic nitride RIE is then used to define inner spacers 1002/1004 in the nitride layer. A large timed overetch is needed to clear the sidewalls of the fins, such that the spacers are present only along the sidewalls of the trench and not on the fins. The minimum pulldown of spacers 1002/1004 is thus the height of the fins and remaining fin hardmask layers. For example, the amount of overetch is between about 50 percent (%) and about 80% of the etch time required to remove the entire nitride layer. During this etch, the nitride portion of the fin hardmasks may also be removed (with the oxide, e.g., $SiO_2$ portion remaining). See FIGS. 9A and 9B, respectively.

Figure 10A:
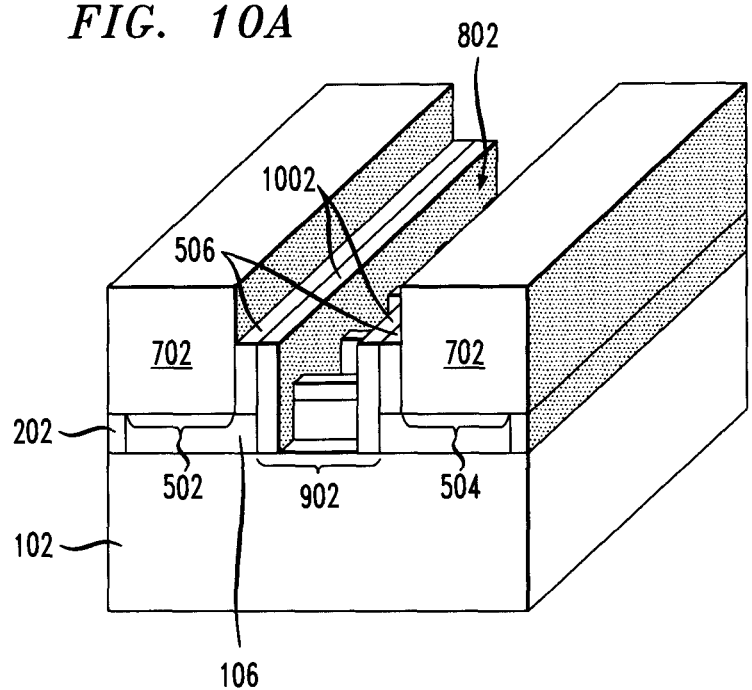
FIG. 10A is a three-dimensional diagram illustrating spacers having been formed in the trench of FIG. 9A according to an embodiment of the present invention.
Figure 10B:
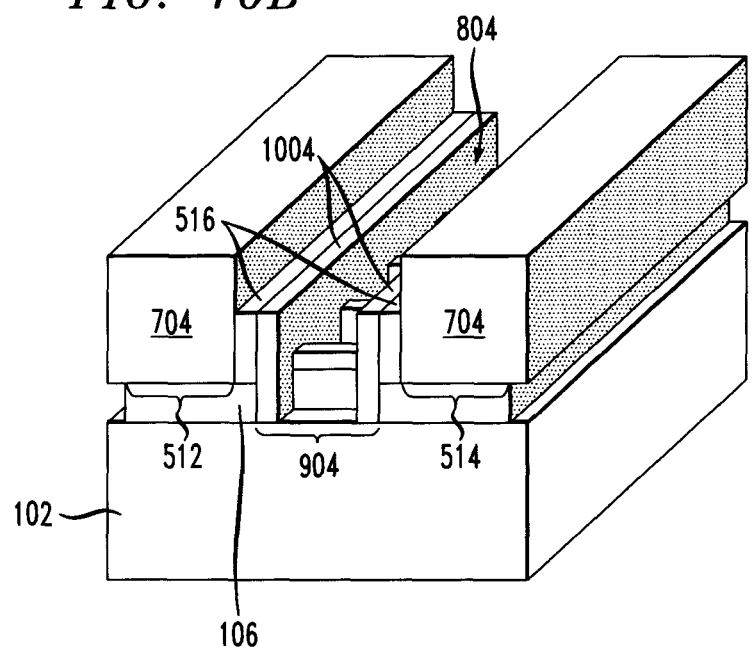
FIG. 10B is a three-dimensional diagram illustrating spacers having been formed in the trench of FIG. 9B according to an embodiment of the present invention.

Next, optionally, any of the fin hardmasks remaining over the fins can be removed using, for example, an isotropic RIE. See FIGS. 11A and 11B. As throughout the description, FIG. 11A which follows from FIG. 10A represents the embodiment wherein STI was used to define the active area and FIG. 11B which follows from FIG. 10B represents the embodiment wherein mesa isolation was used to define the active area. Removing the fin hardmasks, however, is not necessary in all situations. For example, the fin hardmasks may be left in place on top of the fins if a double gate device structure, with channels only on the vertical surfaces of fins (i.e., a finFET), is desired. The fin hardmasks may be removed if a triple gate device structure (i.e., a frigate), with channels on both vertical surfaces as well as the top surface of the fins, is desired.

Figure 11A:
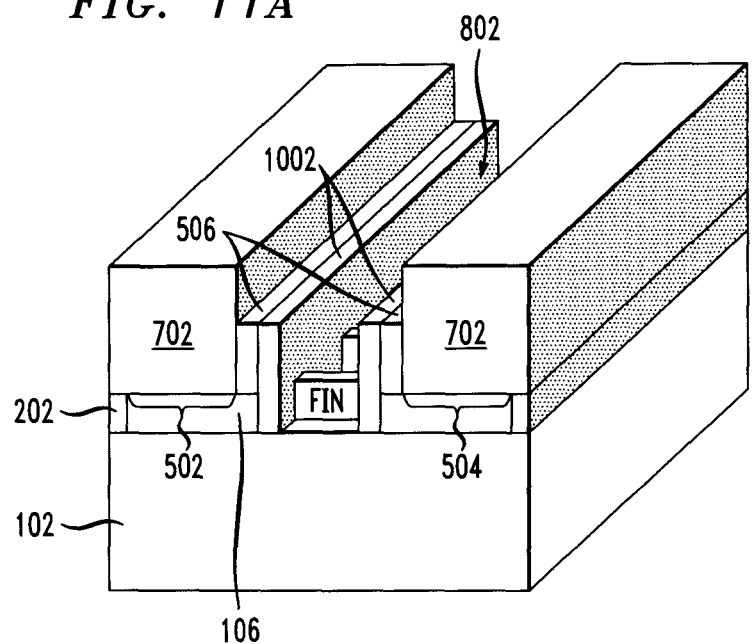
FIG. 11A is a three-dimensional diagram illustrating remaining fin hardmasks from FIG. 10A having been removed from on top of the fins according to an embodiment of the present invention.
Figure 11B:
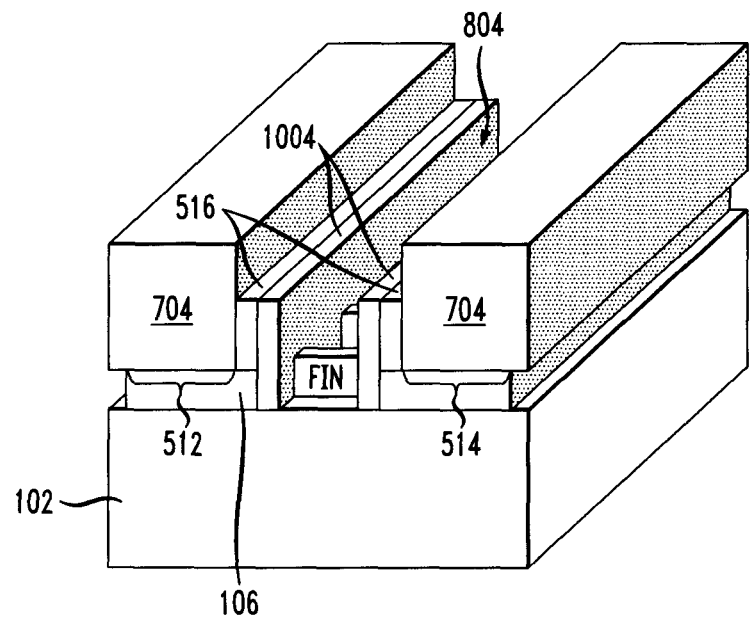
FIG. 11B is a three-dimensional diagram illustrating remaining fin hardmasks from FIG. 10B having been removed from on top of the fins according to an embodiment of the present invention.
Figure 12A:
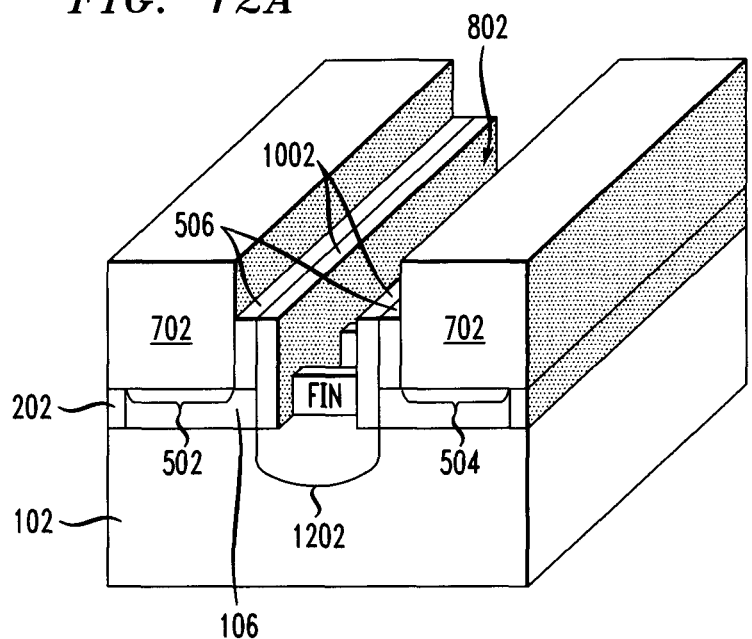
FIG. 12A is a three-dimensional diagram illustrating an exposed portion of an insulator of FIG. 11A in the trench, between the fins, having been recessed to optionally provide for a gate-all-around configuration according to an embodiment of the present invention.
Figure 12B:
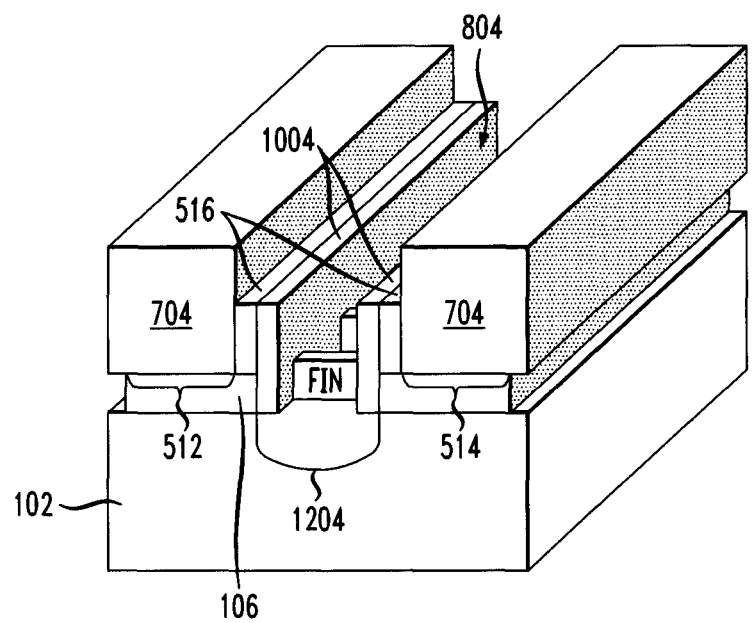
FIG. 12B is a three-dimensional diagram illustrating an exposed portion of an insulator of FIG. 11B in the trench, between the fins, having been recessed to optionally provide for a gate-all-around configuration according to an embodiment of the present invention.

Optionally, if a gate-all-around device structure, with channels on all four sides of the fin, is desired, then an exposed portion 1202/1204 of the BOX 102 in the trench between the fins may be undercut/recessed. See FIGS. 12A and 12B, respectively. As throughout the description, FIG. 12A which follows from FIG. 11A represents the embodiment wherein STI was used to define the active area and FIG. 12B which follows from FIG. 11B represents the embodiment wherein mesa isolation was used to define the active area. This step is optional. According to an exemplary embodiment, portion 1202/1204 of the BOX 102 is undercut using an isotropic wet etch such as HF. This process exposes a continuous surface around each of the fins in the channel region. The replacement gate can then be formed so as to completely surround each of the fins (i.e., a gate-all-around configuration). See, for example, FIGS. 15A and 15B, described below.

Figure 13A:
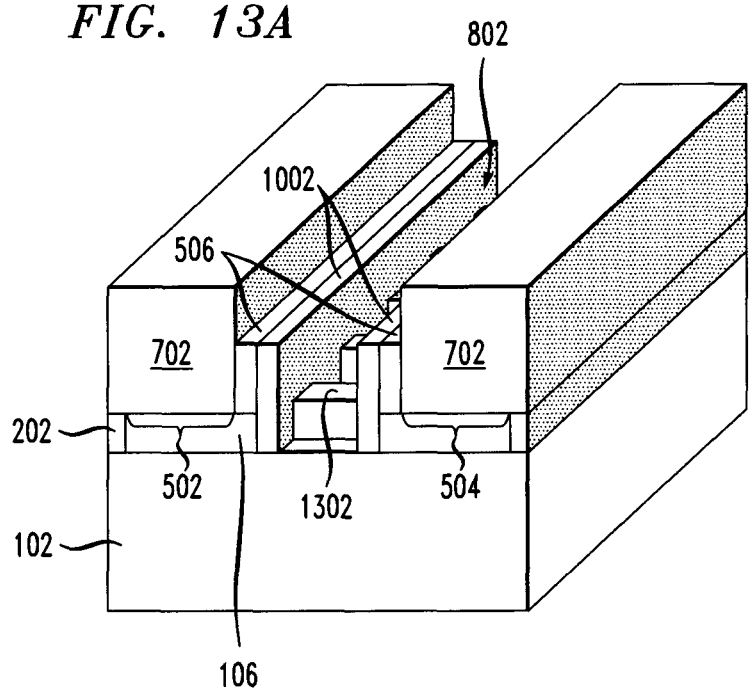
FIG. 13A is a three-dimensional diagram illustrating an optional sacrificial oxide layer having been grown on the fins of FIG. 11A according to an embodiment of the present invention.
Figure 13B:
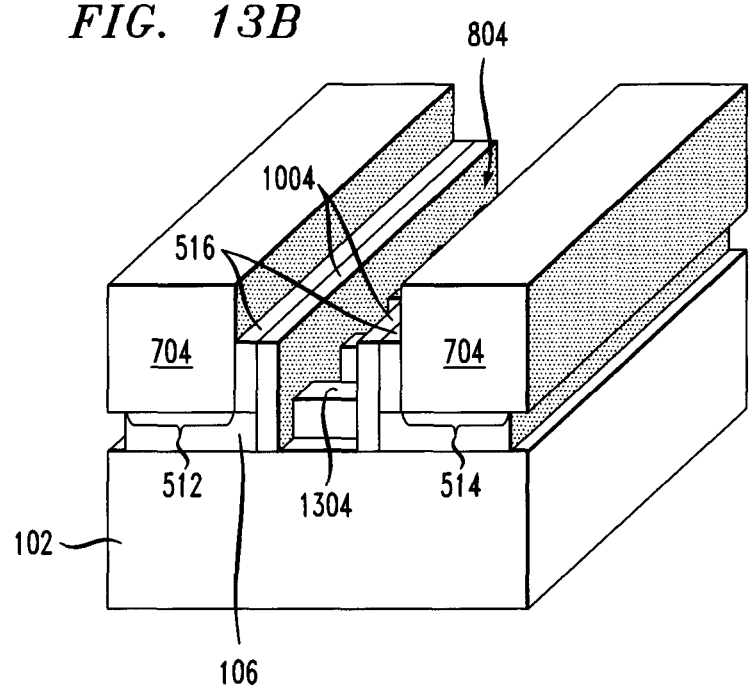
FIG. 13B is a three-dimensional diagram illustrating an optional sacrificial oxide layer having been grown on the fins of FIG. 11B according to an embodiment of the present invention.
Figure 14A:
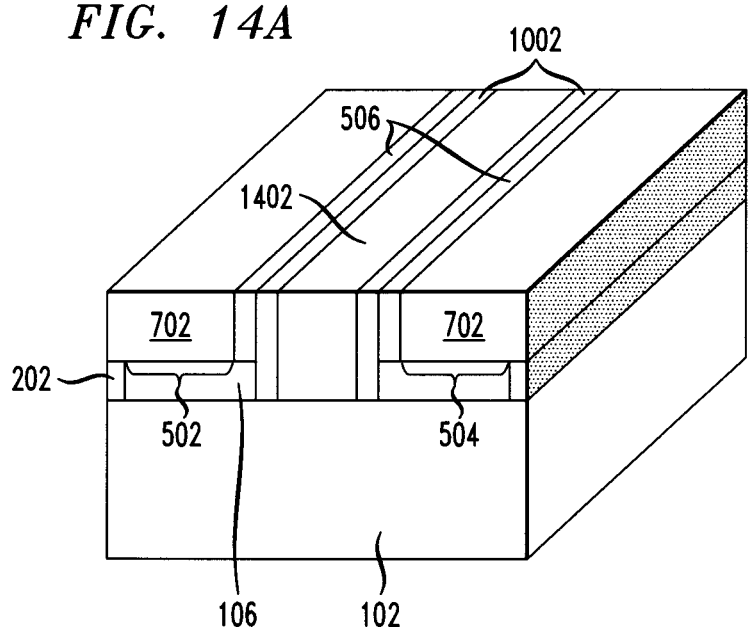
FIG. 14A is a three-dimensional diagram illustrating a replacement gate having been formed in the trench of FIG. 13A according to an embodiment of the present invention.
Figure 14B:
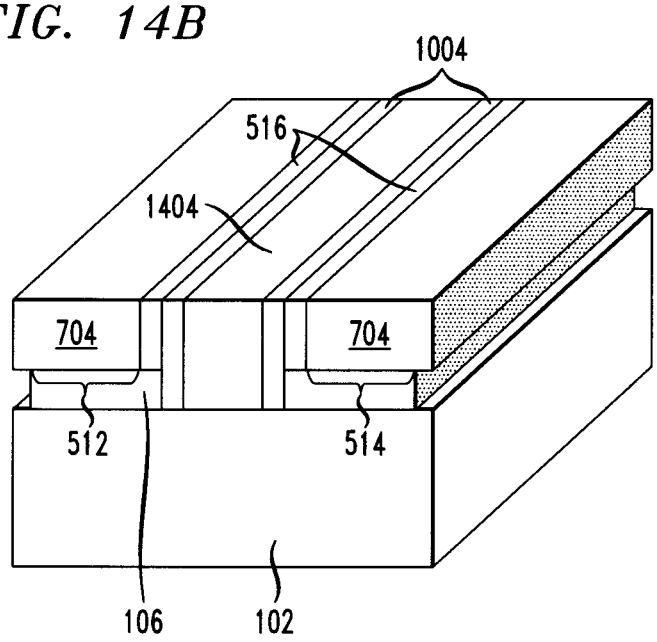
FIG. 14B is a three-dimensional diagram illustrating a replacement gate having been formed in the trench of FIG. 13B according to an embodiment of the present invention.

Further, channel surface optimization processes may optionally be performed to improve surface charge mobility and reduce interface traps. By way of example only, a thin sacrificial oxide layer 1302/1304 may be thermally grown on the exposed surfaces of the fins (i.e., covering the exposed surfaces of the fins such that the fins are not visible in this depiction) and then stripped to remove with it a surface layer of the fin channels which may have been damaged during plasma processing, thereby creating a smoother channel surface. See FIGS. 13A and 13B, respectively. Alternatively, an anneal from about 600° C. to about 900° C. in the presence of a gas such as hydrogen ($H_2$) may be performed to allow limited reflow of atoms at the surface of the fin channels to repair damaged sites or create a smoother channel surface. While FIGS. 13A/13B follow from FIGS. 11A/11B, the same process illustrated in FIGS. 13A/13B may be performed in the optional gate-all-around embodiments shown in FIGS. 12A/12B, respectively. As throughout the description, FIG. 13A represents the embodiment wherein STI was used to define the active area and FIG. 13B represents the embodiment wherein mesa isolation was used to define the active area.

Finally, a replacement gate stack 1402/1404 is formed. See FIGS. 14A and 14B, respectively. As throughout the description, FIG. 14A which follows from FIG. 13A represents the embodiment wherein STI was used to define the active area and FIG. 14B which follows from FIG. 13B represents the embodiment wherein mesa isolation was used to define the active area. To form replacement gate stack 1402/1404 a stack of replacement gate materials is formed through sequential deposition processes both in trench 802/804 and over the dielectric filler material. Specifically, according to an exemplary embodiment, the stack of replacement gate materials includes a gate dielectric (to separate the gate from the fin channels) and a gate metal on the gate dielectric. Thus, in this example, the replacement gate formation process begins by first depositing a suitable gate dielectric in trench 802/804 and over the dielectric filler material. Suitable gate dielectrics include, but are not limited to, $SiO_2$ and/or $HfO_2$. Next, a suitable gate metal or metals is/are deposited over the gate dielectric (i.e., such that the stack of replacement gate materials is present in trench 802/804 and over the dielectric filler material). In one exemplary embodiment, a workfunction setting metal in combination with a fill metal is used as the gate metal. For example, a workfunction setting metal(s) is first deposited on the gate dielectric. Suitable workfunction setting gate metals include, but are not limited to, titanium nitride (TiN) and/or TaN. Next, a fill metal is deposited on the workfunction setting metal. Suitable fill metals include, but are not limited to, tungsten (W) and/or aluminum (Al). Each of the layers in the stack of replacement gate materials may be deposited, for example, by CVD or ALD.

The deposited stack of replacement gate materials will overfill the trench 802/804. According to an exemplary embodiment, this excess material is removed, i.e., trimmed away, from the replacement gate using CMP in order to remove any deposited replacement gate material that is not inside a gate trench (which may also remove some of the dielectric filler material 702/704, see FIGS. 14A and 14B, respectively). The result is a replacement gate stack that partially surrounds each of the fins. In the case of an all-around-gate, the gate completely surrounds at least a portion of each of the fins.

Figure 15A:
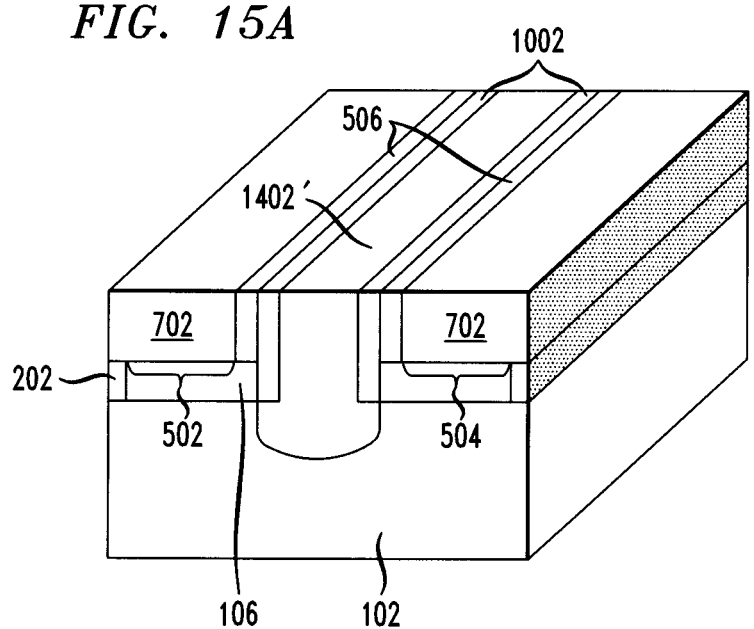
FIG. 15A is a three-dimensional diagram illustrating an all-around-gate replacement gate having been formed in the trench of FIG. 12A according to an embodiment of the present invention.
Figure 15B:
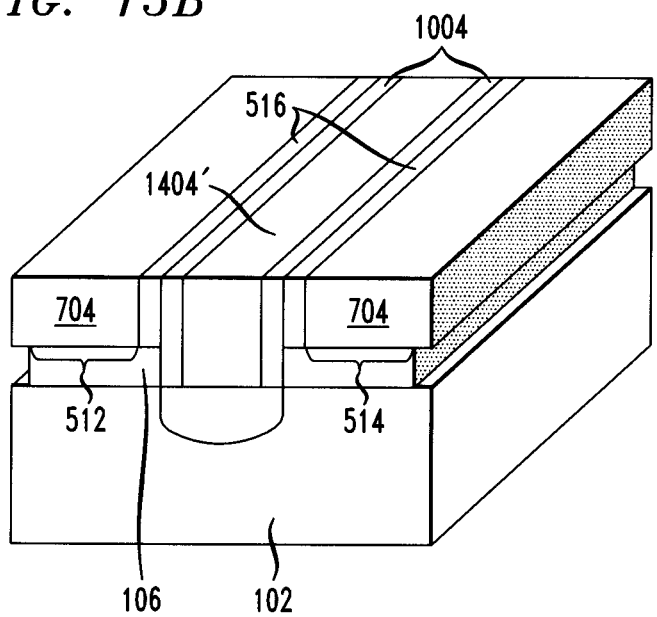
FIG. 15B is a three-dimensional diagram illustrating an all-around-gate replacement gate having been formed in the trench of FIG. 12B according to an embodiment of the present invention.

An optional all-around-gate configuration is shown illustrated in FIGS. 15A and 15B. While FIGS. 15A and 15B follow from FIGS. 12A and 12B, respectively, it is to be understood that any intervening steps, such as those shown for example in FIGS. 13A and 13B may be performed in the same manner as described above. As throughout the description, FIG. 15A represents the embodiment wherein STI was used to define the active area and FIG. 15B which represents the embodiment wherein mesa isolation was used to define the active area. As described in conjunction with the description of FIGS. 12A and 12B, above, if a gate-all-around device structure, with channels on all four sides of the fin, is desired, then an exposed portion of the BOX 102 in the trench between the fins may be undercut/recessed to expose a continuous surface around each of the fins in the channel region. Following from that optional embodiment, FIGS. 15A and 15B illustrate how the replacement gate stack, once formed as described above, completely surrounds at least a portion of each of the fins (the gate-all-around replacement gate stack is labeled in FIGS. 15A and 15B as 1402' and 1404', respectively, so as to distinguish them from the Ω-shaped replacement gate stack in FIGS. 14A and 14B which does not completely surround each of the fins, however both types of replacement gate stacks are formed (and processed, e.g., trimmed) in the exact same manner as described above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field effect transistor device, comprising:
   a source region;
   a drain region;
   a plurality of fins connecting the source region and the drain region, wherein the fins serve as a channel region of the device, and wherein the fins have a pitch of from about 20 nm to about 200 nm and each of the fins has a width of from about 2 nm to about 40 nm;
   a metal gate which at least partially surrounds each of the fins, wherein the source and the drain regions are self-aligned with the metal gate;
   a dielectric filler layer around the metal gate;
   a first set of spacers between the dielectric filler layer and the metal gate, wherein the fins are present only between the first set of spacers; and
   a second set of spacers between the first set of spacers and the metal gate, wherein the second set of spacers is present over the fins.

2. The device of claim 1, wherein the fins are present over an insulator, and wherein the insulator is undercut beneath the fins such that the metal gate completely surrounds each of the fins in a gate-all-around configuration.

3. The device of claim 1, further comprising a gate dielectric on the fins that separates the fins from the metal gate.

4. The device of claim 3, wherein the gate dielectric comprises hafnium oxide.

5. The device of claim 1, wherein the metal gate comprises at least one workfunction setting metal and at least one fill metal.

6. The device of claim 5, wherein the workfunction setting metal comprises one or more of titanium nitride and tantalum nitride and wherein the fill metal comprises one or more of tungsten and aluminum.

* * * * *